(12) United States Patent
Harada et al.

(10) Patent No.: US 11,145,589 B2
(45) Date of Patent: Oct. 12, 2021

(54) SEMICONDUCTOR MODULE BONDING STRUCTURE AND BONDING METHOD

(71) Applicant: DENSO CORPORATION, Kariya (JP)

(72) Inventors: Naohisa Harada, Kariya (JP); Hiroshi Kondo, Kariya (JP); Kyosuke Ishikawa, Kariya (JP); Atsushi Kawade, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/807,927

(22) Filed: Mar. 3, 2020

(65) Prior Publication Data

US 2020/0203269 A1    Jun. 25, 2020

Related U.S. Application Data

(63) Continuation of application No. PCT/JP2018/032339, filed on Aug. 31, 2018.

(30) Foreign Application Priority Data

Sep. 5, 2017  (JP) .............................. JP2017-170404

(51) Int. Cl.
*H01L 23/50* (2006.01)
*H01L 23/492* (2006.01)
*H01L 23/00* (2006.01)

(52) U.S. Cl.
CPC ............ *H01L 23/50* (2013.01); *H01L 23/492* (2013.01); *H01L 24/83* (2013.01); *H01L 2224/83893* (2013.01)

(58) Field of Classification Search
CPC ........ H02M 7/003; H01L 23/492; H01R 4/02; H01R 4/027; H01R 4/26; H05K 2201/10272; B23K 33/00
See application file for complete search history.

(56) References Cited

U.S. PATENT DOCUMENTS 6,241,144 B1 * 6/2001 Mandon ................. B23K 33/00
                                                              172/762
2012/0006595 A1    1/2012 Tachibana

FOREIGN PATENT DOCUMENTS

JP         2011114966 A  *  6/2011

* cited by examiner

*Primary Examiner* — Alia Sabur
(74) *Attorney, Agent, or Firm* — Oliff PLC

(57) ABSTRACT

A semiconductor module bonding structure includes: a semiconductor module including a semiconductor element and a positive terminal which is a plate-shaped power terminal electrically connected to the semiconductor element; and a main P bus bar which is a bus bar including a plate-shaped bonding part bonded to the positive terminal of the semiconductor module. The positive terminal of the semiconductor module which is one of the positive terminal and the bonding part of the main P bus bar that has a relatively small thickness is configures to be wider than the bonding part which is the other having a relatively large thickness, and the positive terminal and the bonding part are bonded together by fusion welding in the state of being arranged so that the respective thickness directions of the positive terminal and the bonding part are orthogonal to each other.

6 Claims, 11 Drawing Sheets

SEMICONDUCTOR MODULE BONDING STRUCTURE AND BONDING METHOD

CROSS-REFERENCE TO RELATED APPLICATION

This application is the U.S. bypass application of International Application No. PCT/JP2018/032339 filed Aug. 31, 2018 which designated the U.S. and claims priority to Japanese Patent Application No. 2017-170404, filed Sep. 5, 2017, the contents of both of which are incorporated herein by reference.

TECHNICAL FIELD

The present disclosure relates to a technique of bonding semiconductor modules.

BACKGROUND

Vehicles such as electric vehicles and hybrid vehicles are equipped with a power conversion device which performs electric power conversion between direct-current (DC) power and alternating-current (AC) power. This power conversion device includes a semiconductor module incorporating a semiconductor element and is configured so that a power terminal of the semiconductor module is electrically connected to a power supply via a busbar module.

SUMMARY

One aspect of the present disclosure is a semiconductor module bonding structure having a semiconductor module including a semiconductor element and a plate-shaped power terminal which is electrically connected to the semiconductor element, and a bus bar including a plate-shaped bonding part, the bonding part being bonded to the power terminal of the semiconductor module.

The power terminal of the semiconductor module and the bonding part of the bus bar are configured such that a width of either planner power terminal or bonding part having a relatively small plate thickness is larger than a plate width of the other one having a relatively large plate thickness, and the power terminal and the bonding part are bonded together by fusion welding in a state where the thickness directions of the power terminal and the bonding part are orthogonal to each other.

Furthermore, another aspect of the present disclosure provides a semiconductor module bonding method for bonding a plate-shaped power terminal which is electrically connected to a semiconductor element, and a plate-shaped bonding part of a bus bar together in a semiconductor module, the semiconductor module bonding method including the steps of preparing the semiconductor module and the bus bar such that one of the power terminal and the bonding part that has a relatively small thickness is configured to be larger than the other having a relatively large thickness, and bonding, in the semiconductor module and the bus bar prepared in the preparing step, boundary portions of the power terminal and the bonding part together by fusion welding in a state where the power terminal and the bonding part are arranged in contact with each other such that the thickness directions of the power terminal and the bonding part are orthogonal to each other.

BRIEF DESCRIPTION OF THE DRAWINGS

The above objects and other objects, features and advantages of the present disclosure will be made clearer by the following detailed description, given referring to the appended drawings. In the accompanying drawings.

DETAILED DESCRIPTION OF THE PREFERRED EMBODIMENTS

Figure 1:
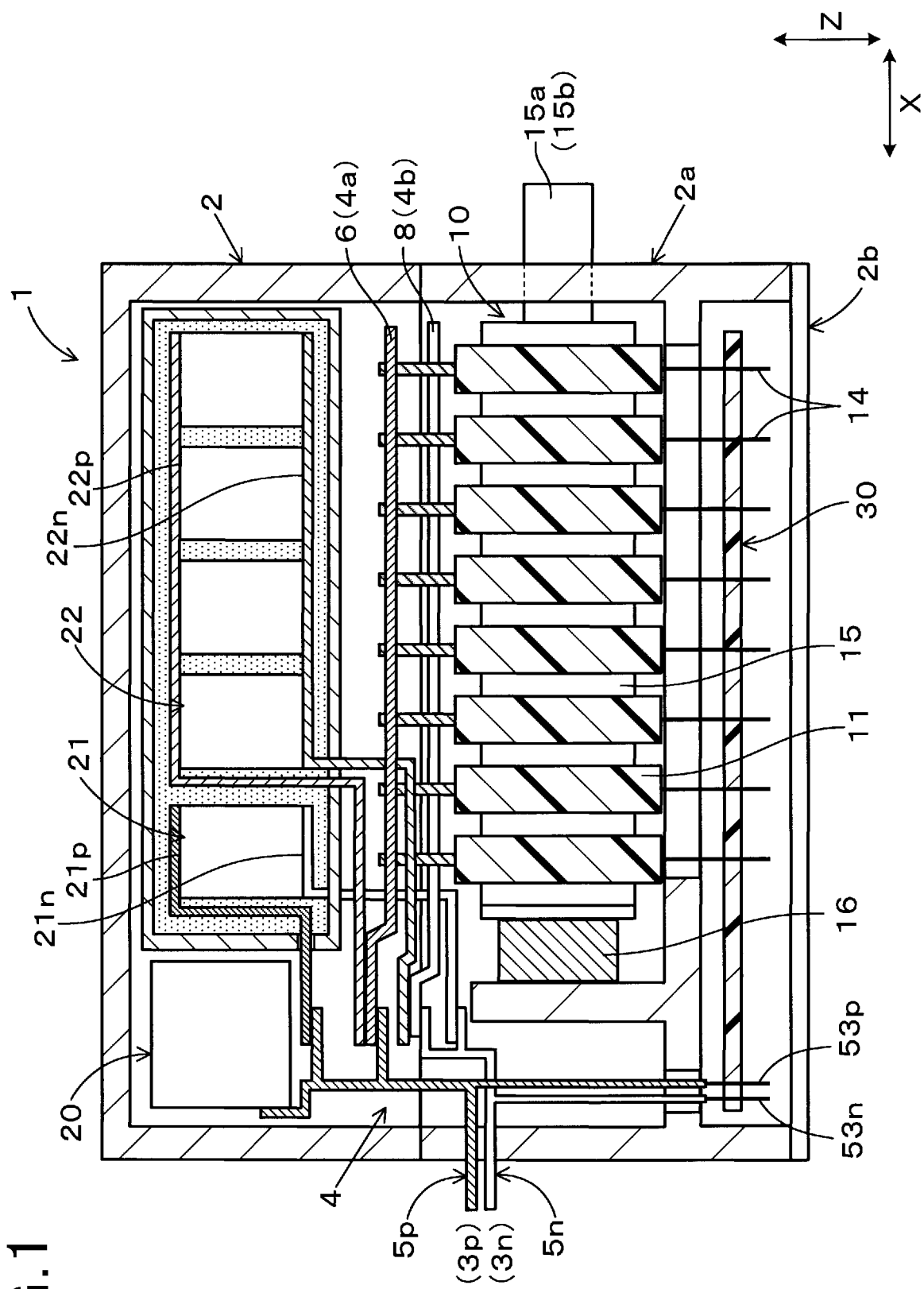
FIG. 1 is a cross-sectional view illustrating an outline of a power conversion device according to a first embodiment.

JP 2012-034566 A discloses a bus bar module. A bus bar included in this bus bar module and serving as a conductor has a flat portion bonded to a flat portion of a power terminal of the semiconductor module by fusion welding. Consequently, a conduction path between the semiconductor module and the power supply is formed.

During a welding process between the power terminal of the semiconductor module and the bus bar, in a phenomenon in which welding heat input externally provided to the boundary portion between the power terminal and the bus bar moves toward the both of them, what is called □thermal conduction□, occurs. At this time, when conduction of welding heat input between the power terminal and the bus bar is off-balance, for example, when a large amount of heat flows toward the bus bar, surplus welding heat input needs to be applied to the boundary portions of the power terminal and the bus bar in order to fuse them. This results in an increase in energy cost for fusion welding.

The present disclosure has been conceived in view of the aforementioned problem and aims to provide a technique effective for minimizing the amount of welding heat input during bonding by means of welding between a power terminal of a semiconductor module and a bus bar.

One aspect of the present disclosure is a semiconductor module bonding structure having a semiconductor module including a semiconductor element and a plate-shaped power terminal which is electrically connected to the semiconductor element, and a bus bar including a plate-shaped bonding part, the bonding part being bonded to the power terminal of the semiconductor module.

The power terminal of the semiconductor module and the bonding part of the bus bar are configured such that a width of either planner power terminal or bonding part having a relatively small plate thickness is larger than a plate width of the other one having a relatively large plate thickness, and the power terminal and the bonding part are bonded together by fusion welding in a state where the thickness directions of the power terminal and the bonding part are orthogonal to each other.

Furthermore, another aspect of the present disclosure provides a semiconductor module bonding method for bonding a plate-shaped power terminal which is electrically connected to a semiconductor element, and a plate-shaped bonding part of a bus bar together in a semiconductor module, the semiconductor module bonding method including the steps of preparing the semiconductor module and the bus bar such that one of the power terminal and the bonding part that has a relatively small thickness is configured to be larger than the other having a relatively large thickness, and bonding, in the semiconductor module and the bus bar prepared in the preparing step, boundary portions of the power terminal and the bonding part together by fusion welding in a state where the power terminal and the bonding part are arranged in contact with each other such that the thickness directions of the power terminal and the bonding part are orthogonal to each other.

With the semiconductor module bonding structure and bonding method, even when the thickness of the power terminal of the semiconductor module and the thickness of the bonding part of the bus bar are different, the amount of welding heat input per unit volume during fusion welding can be balanced between the power terminal and the bonding part of the bus bar by adjusting the shapes of the power terminal and the bonding part to set the width relationship therebetween as appropriate, according to the thickness relationship therebetween. This prevents surplus welding heat input from being applied to the boundary portions and fusing both the power terminal and the bonding part.

As described above, according to each of the above-described aspects, the amount of welding heat input during welding to bond the power terminal of the semiconductor module and the bus bar can be minimized.

Hereinafter, embodiments of a power conversion device including a semiconductor module are described with reference to the drawings.

Note that in the drawings in the present application, unless otherwise noted, an arrow X represents a first direction which is a stacking direction of the semiconductor module, an arrow Y represents a second direction which is a width direction of the semiconductor module, and an arrow Z represents a third direction perpendicular to both the first direction and the second direction.

First Embodiment

As illustrated in FIG. 1, a power conversion device 1 according to a first embodiment is used to perform electric power conversion between direct-current power and alternating-current power, and includes elements such as a semiconductor laminate unit 10, electronic components 20, 21, 22, and a control circuit board 30. These elements are housed in a space defined by an upper case 2, a lower case 2a, and a cover 2b.

This power conversion device 1 is, for example, mounted on an electric vehicle, a hybrid vehicle, or the like, and used as an inverter that converts direct-current power into alternating-current power needed to drive a drive motor.

The semiconductor laminate unit 10 includes a plurality of (in the present embodiment, eight) semiconductor modules 11 and a plurality of condenser tubes 15. In this semiconductor laminate unit 10, the plurality of semiconductor modules 11 and the plurality of condenser tubes 15 are alternately stacked and arranged in the first direction X and pressed by a pressure member 16 so that the plurality of semiconductor modules 11 and the plurality of condenser tubes 15 come into close contact with each other. In other words, each semiconductor module 11 is sandwiched by two adjacent condenser tubes 15, 15 from opposite sides in the first direction X.

The condenser tube 15 is configured so that a refrigerant that has flowed thereto through an inlet tube 15a flows out through an outlet tube 15b. At this time, heat generated at the semiconductor module 11 flows toward the refrigerant flowing in the condenser tube 15, and thus the semiconductor module 11 is cooled.

The electronic component 20 (hereinafter referred to as a reactor 20) is a reactor that converts electric energy into magnetic energy using an inductor. The reactor 20 forms a portion of a booster circuit for increasing an input voltage at the semiconductor module 11.

The other electronic component 21 (hereinafter referred to simply as a capacitor 21) is a filter capacitor for removing a noise voltage. As with the reactor 20, the capacitor 21 forms a portion of the booster circuit for increasing the input voltage at the semiconductor module 11.

The other electronic component 22 (hereinafter referred to simply as a capacitor 22) is a smoothing capacitor for smoothing the input voltage or the increased voltage. The capacitor 22 forms a portion of a conversion circuit that converts direct-current power into alternating-current power.

The power conversion device 1 includes a bus bar module 4 constituting a power supply path between the direct-current power supply 3 (refer to FIG. 3) and the semiconductor module 11. The bus bar module 4 includes an input P bus bar 5p, an input N bus bar 5n, a main P bus bar 6, and a main N bus bar 8. Each of these bus bars 5p, 5n, 6, 8 is formed of a metal plate material including oxygen-free copper.

Note that as the materials of these bus bars 5p, 5n, 6, 8, metal materials other than the oxygen-free copper can be used as needed.

The input P bus bar 5p is electrically connected to each of a positive electrode 3p of the direct-current power supply 3, the reactor 20, a positive terminal 21p of the capacitor 21, a positive terminal 22p of the capacitor 22, the main P bus bar 6, and the control circuit board 30.

The input N bus bar 5n is electrically connected to each of a negative electrode 3n of the direct-current power supply 3, a negative terminal 21n of the capacitor 21, a negative terminal 22n of the capacitor 22, the main N bus bar 8, and the control circuit board 30.

Figure 2:
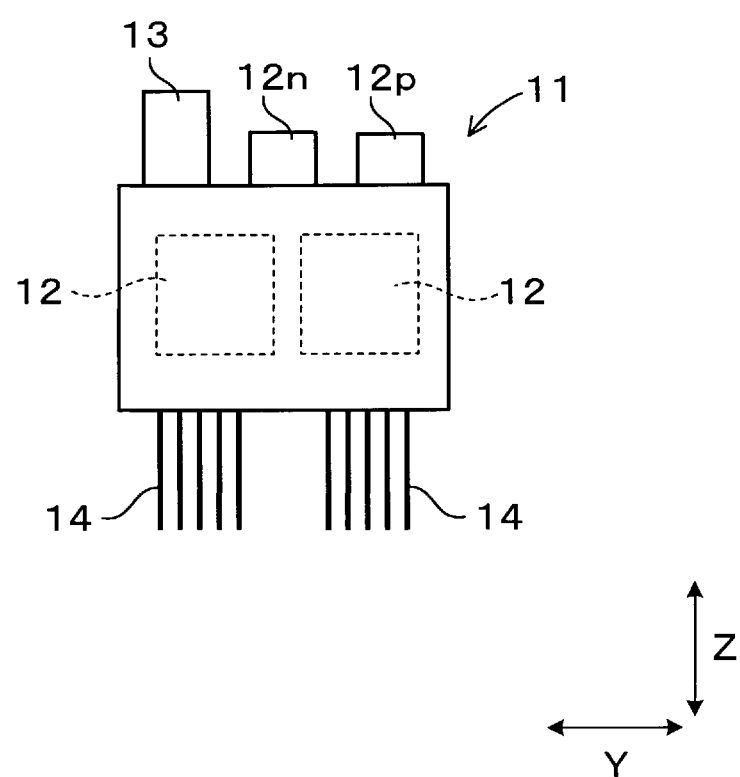
FIG. 2 is a plan view of a semiconductor module in FIG. 1.

As illustrated in FIG. 2, the semiconductor module 11 is a 2-in-1 semiconductor module incorporating two semiconductor elements 12 such as an insulated-gate bipolar transistor (IGBT), which converts direct-current power into alternating-current power. The semiconductor module 11 includes a positive terminal 12p, a negative terminal 12n, and an output terminal 13, each of which is a power terminal, and a plurality of control terminals 14. Each of these terminals 12p, 12n, 13, 14 is a plate member formed by treating a surface of a metal plate material including oxygen-free copper with a Ni—P plating process.

Note that as the materials of these terminals 12p, 12n, 13, 14, metal materials other than the oxygen-free copper can be used as needed.

The positive terminal 12p of the semiconductor module 11 is electrically connected to each of the semiconductor element 12 and the main P bus bar 6. The negative terminal 12n of the semiconductor module 11 is electrically connected to each of the semiconductor element 12 and the main N bus bar 8. The output terminal 13 is electrically connected to a three-phase AC motor M for traveling vehicles (refer to FIG. 3). The control terminal 14 is electrically connected to the control circuit board 30.

Figure 3:
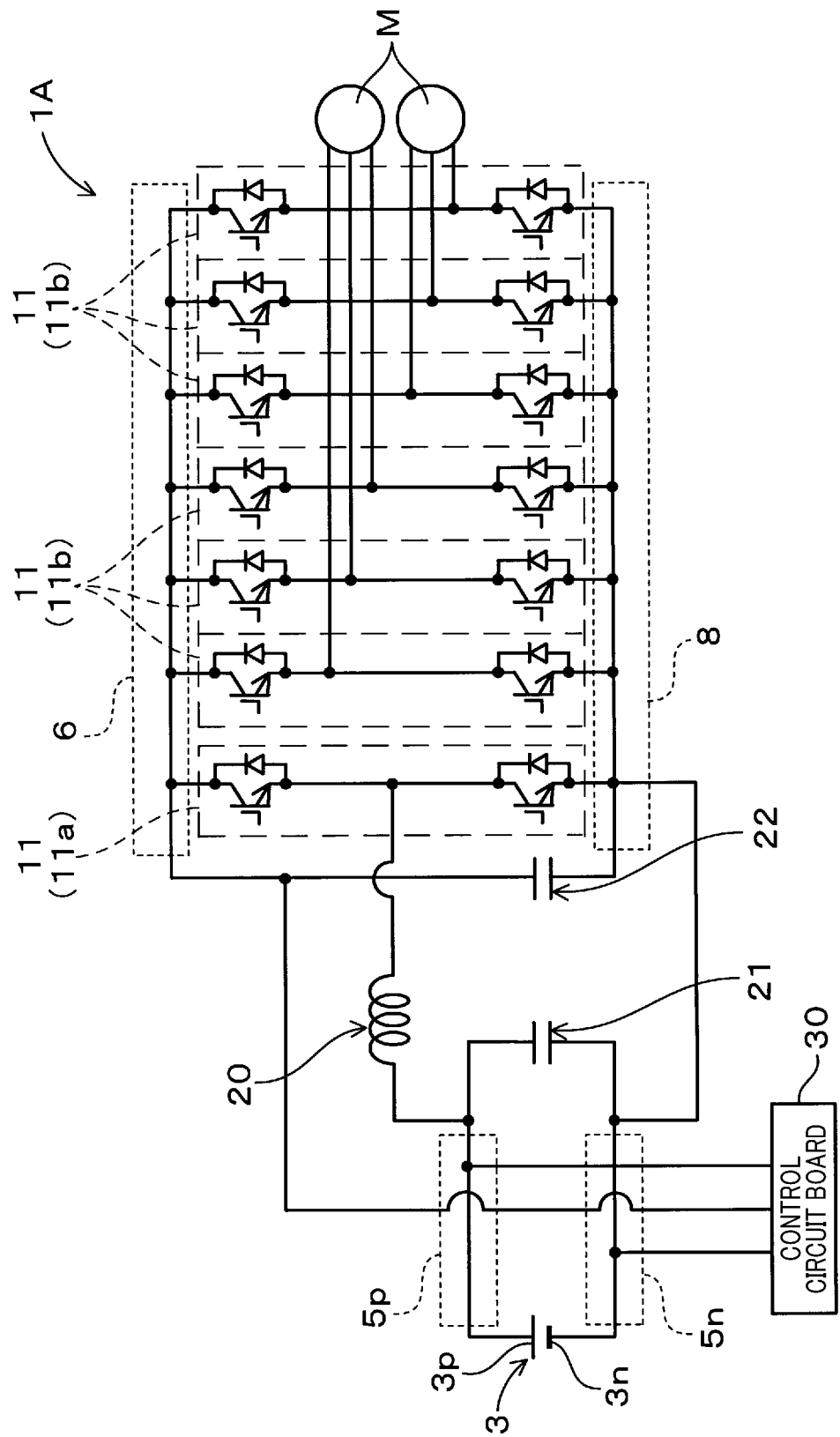
FIG. 3 is an inverter circuit diagram of the power conversion device.

As illustrated in FIG. 3, in an inverter circuit 1A of the power conversion device 1, the control circuit board 30 controls the switching operations (turning ON/OFF) of the semiconductor element 12 incorporated into each semiconductor module 11, and the direct-current power at a direct-current power supply 5 is converted into the alternating-current power.

In the present embodiment, the reactor 20 and the semiconductor module 11a constitute a booster unit of the inverter circuit 1A. This booster unit functions to increase the voltage at the direct-current power supply 5.

Meanwhile, the smoothing capacitor 22 and the semiconductor module 11b constitute a conversion unit of the inverter circuit 1A. This conversion unit functions to convert the direct-current power resulting from an increase in the voltage by the booster unit into alternating-current power. With the alternating-current power obtained by this conversion unit, the three-phase AC motor M is driven.

Next, two bonding structures 4a, 4b of the semiconductor module 11, which are characteristic portions of the above-described bus bar module 4, are described.

Figure 4:
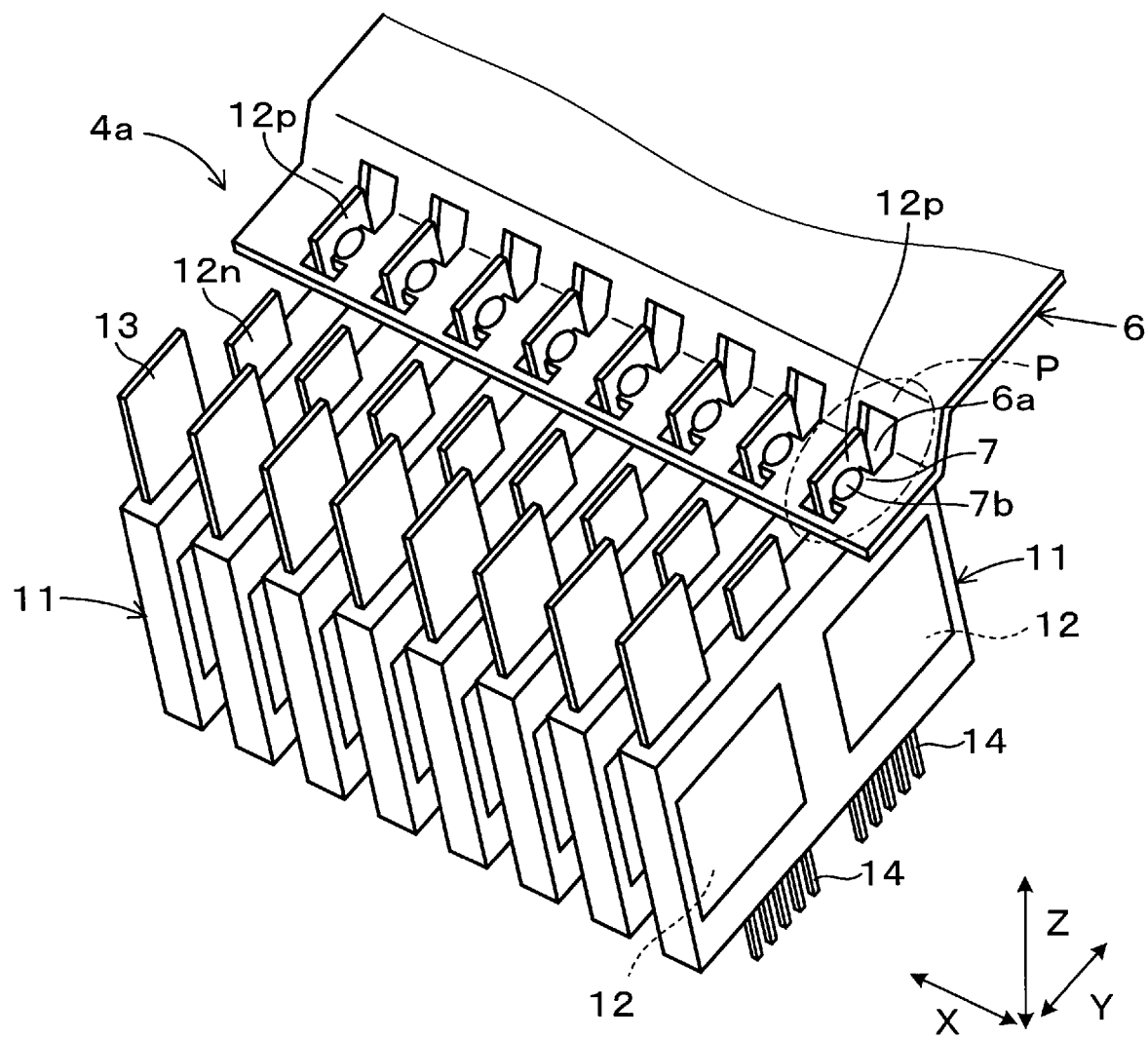
FIG. 4 is a perspective view of a bonding structure for a positive terminal of the semiconductor module and a main P bus bar in FIG. 1.

As illustrated in FIG. 4, the bonding structure 4a is used for the positive terminal 12p of the semiconductor module 11 and the main P bus bar 6 and includes the semiconductor module 11 and the main P bus bar 6 including a plate-shaped bonding part 7 which is bonded to the positive terminal 12p serving as a power terminal of the semiconductor module 11. This bonding structure 4a includes a welded part 7b resulting from fusion and solidification of the boundary portion between the positive terminal 12p and the bonding part 7.

Note that as long as the main P bus bar 6 includes at least the plate-shaped bonding part 7 in order for bonding to the positive terminal 12p of the semiconductor module 11, the overall shape of the bus bar can be changed, as appropriate.

Figure 5:
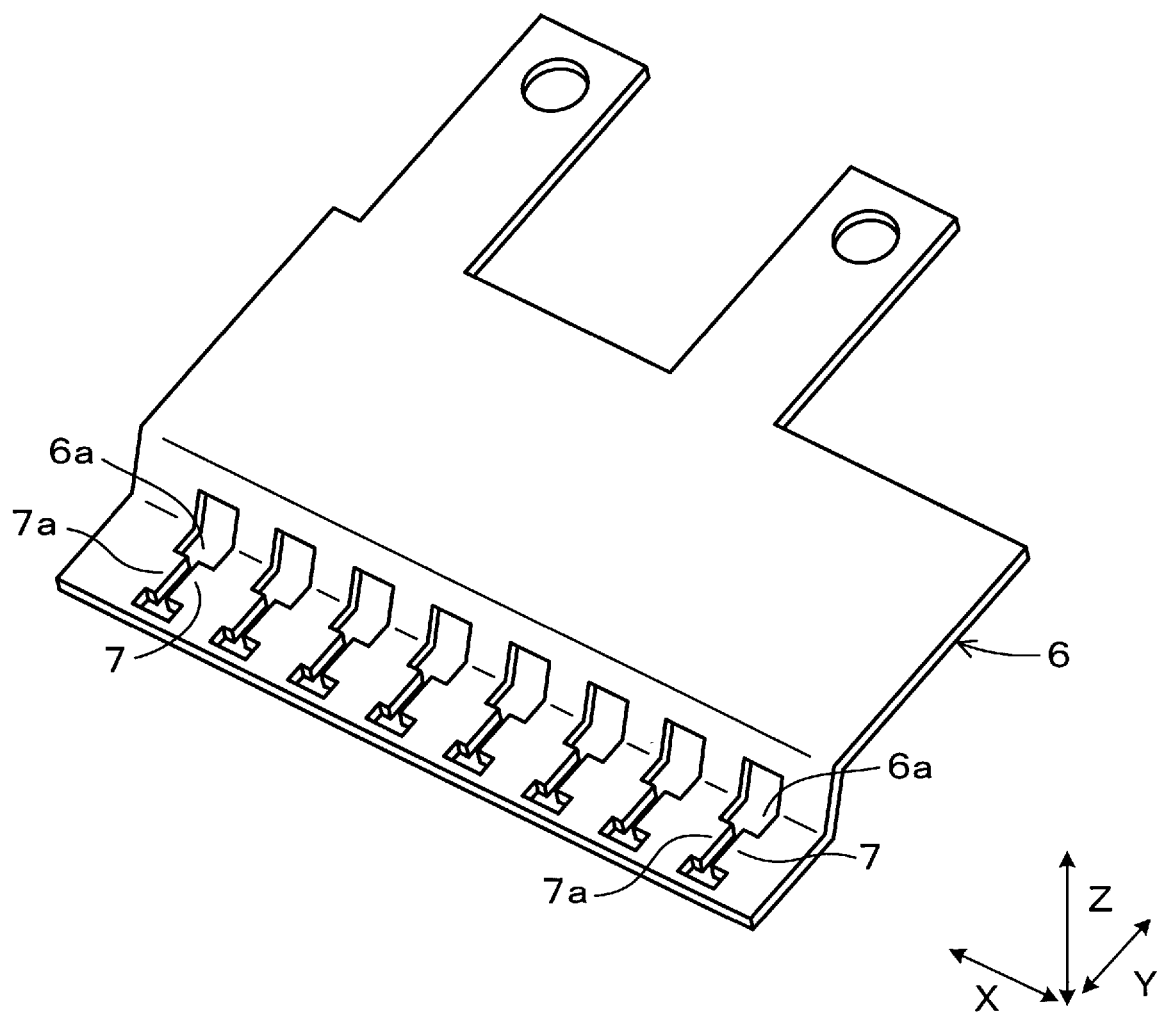
FIG. 5 is a perspective view of the main P bus bar in FIG. 4.
Figure 6:
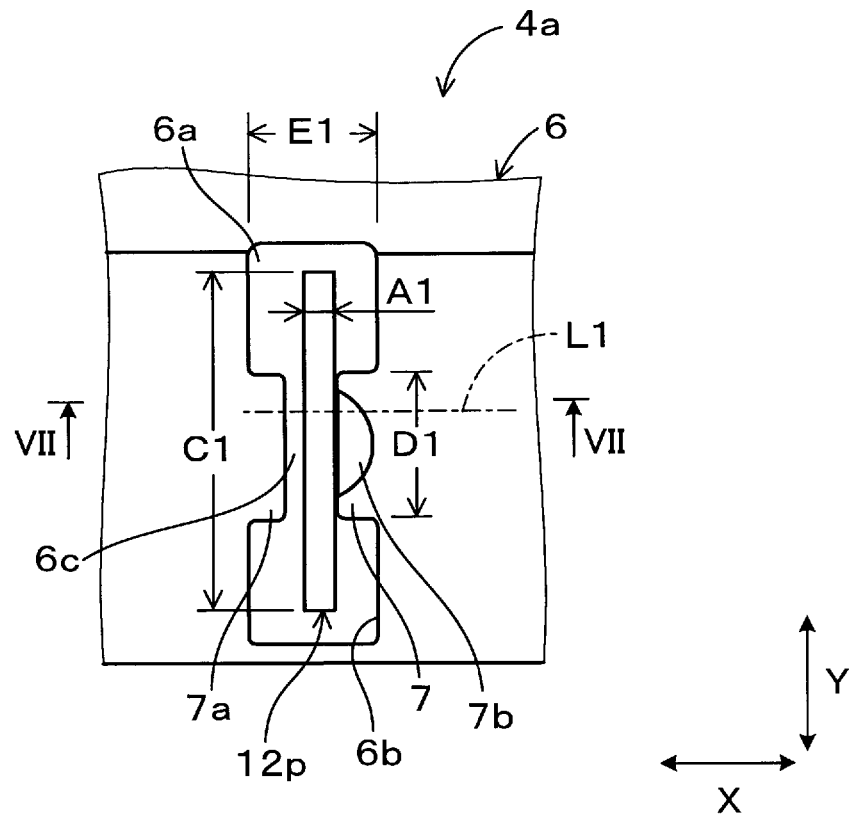
FIG. 6 is a plan view of a P region in FIG. 4.

As illustrated in FIGS. 5 and 6, the main P bus bar 6 has a plurality of (the same number as the semiconductor modules 11) through-holes 6a into each of which the positive terminal 12p can be inserted and which extend in the second direction Y which is the width direction of the positive terminal 12p, and the bonding part 7 is disposed inside each of the through-holes 6a. In particular, the bonding part 7 is constituted by a projection in which a part of an inner periphery 6b of the through-hole 6a projects inward. With the present configuration, the positive terminal 12p is fused and welded to the bonding part 7 in a state of being inserted into the through-hole 6a of the main P bus bar 6.

For this fusion welding, the through-hole 6a of the main P bus bar 6 has an opening width (opening size in the first direction X) and an opening length (opening size in the second direction Y) such that the positive terminal 12p can be inserted. Furthermore, the distance between two adjacent through-holes 6a, 6a is the same as the distance between two adjacent positive terminals 12p, 12p of the semiconductor module 11. Moreover, the through-hole 6a is configured so that an opening size E1 in the first direction X which is the thickness direction of the positive terminal 12p becomes smallest at a narrow portion 6c which corresponds to the bonding part 7.

Furthermore, when the bonding part 7 is denoted as a first projection 7, the main P bus bar 6 includes a second projection 7a formed by projecting a part of an inner periphery 6b of the through-hole 6a inward, separately from the first projection 7, and the first projection 7 and the second projection 7a are arranged facing each other in the first direction X which is the thickness direction of the positive terminal 12p.

As illustrated in FIG. 6, the first projection 7 and the second projection 7a are disposed on a virtual line L1 extending in the first direction X which is the thickness direction of the positive terminal 12p and have approximately the same widths D1 in the second direction Y which is the width direction of the positive terminal 12p.

Figure 7:
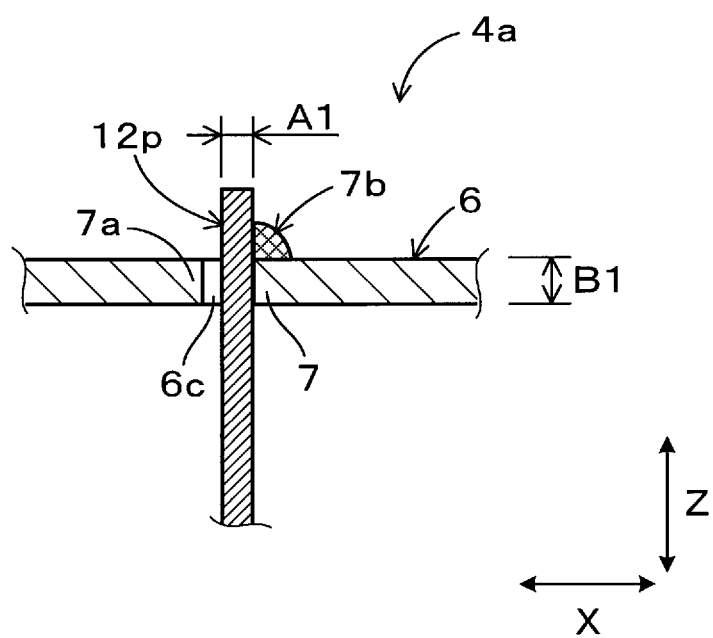
FIG. 7 is a cross-sectional view taken along a line VII-VII in FIG. 6.

As illustrated in FIGS. 6 and 7, a thickness A1 of the positive terminal 12p is less than a thickness B1 of the bonding part 7, and a width C1 of the positive terminal 12p is larger than the width D1 of the bonding part 7. In other words, in the bonding structure 4a, the positive terminal 12p and the bonding part 7 are configured so that one of the positive terminal 12p and the bonding part 7 that has a relatively small thickness is wider than the other having a relatively large thickness.

Furthermore, the positive terminal 12p and the bonding part 7 are bonded together by fusion welding in a state where the thickness direction of the positive terminal 12p and the thickness direction of the bonding part 7 are orthogonal to each other. In this case, the first direction X which is the thickness direction of the positive terminal 12p and the third direction Z which is the thickness direction of the bonding part 7 are orthogonal to each other (refer to FIG. 7).

Figure 8:
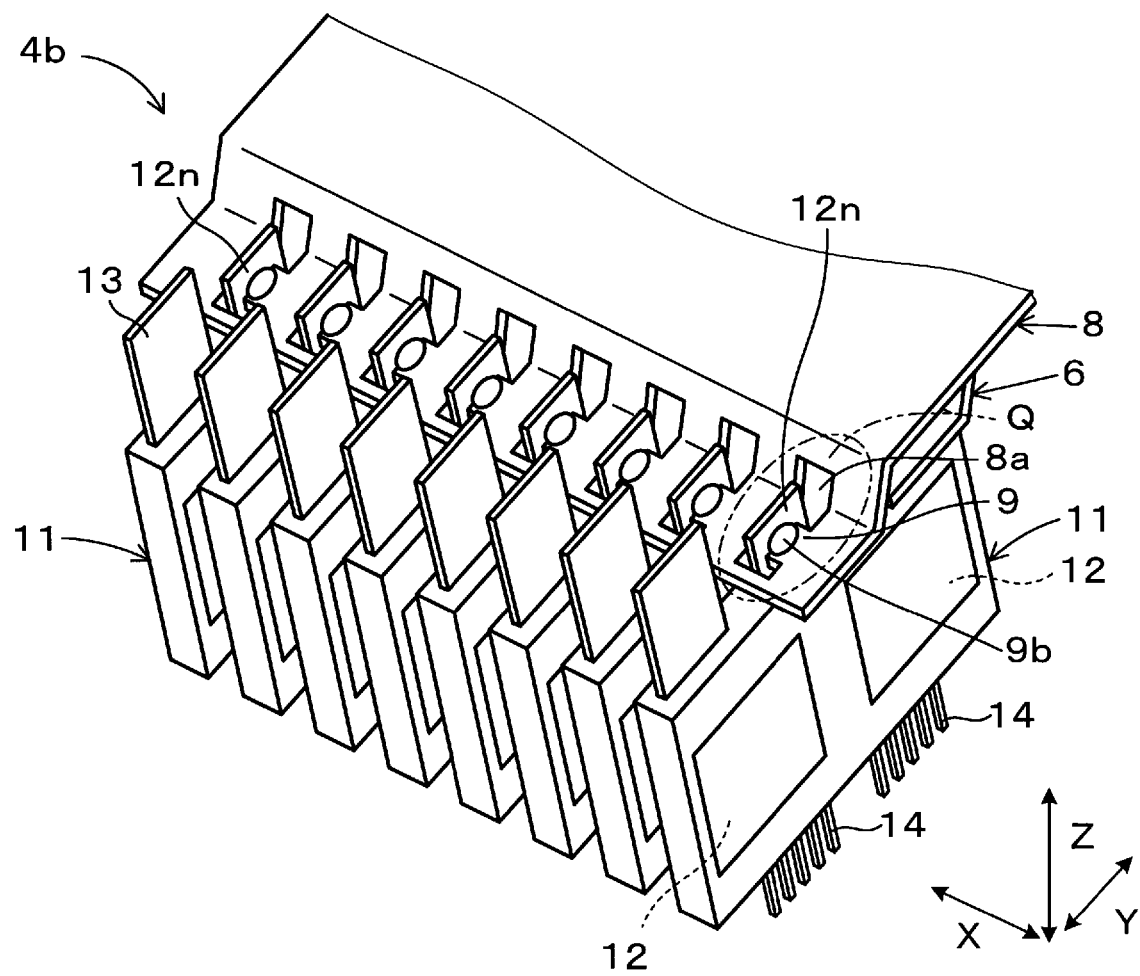
FIG. 8 is a perspective view of a bonding structure for a negative terminal of the semiconductor module and a main N bus bar in FIG. 1.

As illustrated in FIG. 8, the bonding structure 4b is used for the negative terminal 12n of the semiconductor module 11 and the main P bus bar 8 and includes the semiconductor module 11 and the main P bus bar 8 including a plate-shaped bonding part 9 which is bonded to the negative terminal 12n serving as a power terminal of the semiconductor module 11. This bonding structure 4b includes a welded part 9b resulting from fusion and solidification of the boundary portion between the negative terminal 12n and the bonding part 9.

Note that as long as the main N bus bar 8 includes at least the plate-shaped bonding part 9 in order for bonding to the negative terminal 12n of the semiconductor module 11, the overall shape of the bus bar can be changed, as appropriate.

Figure 9:
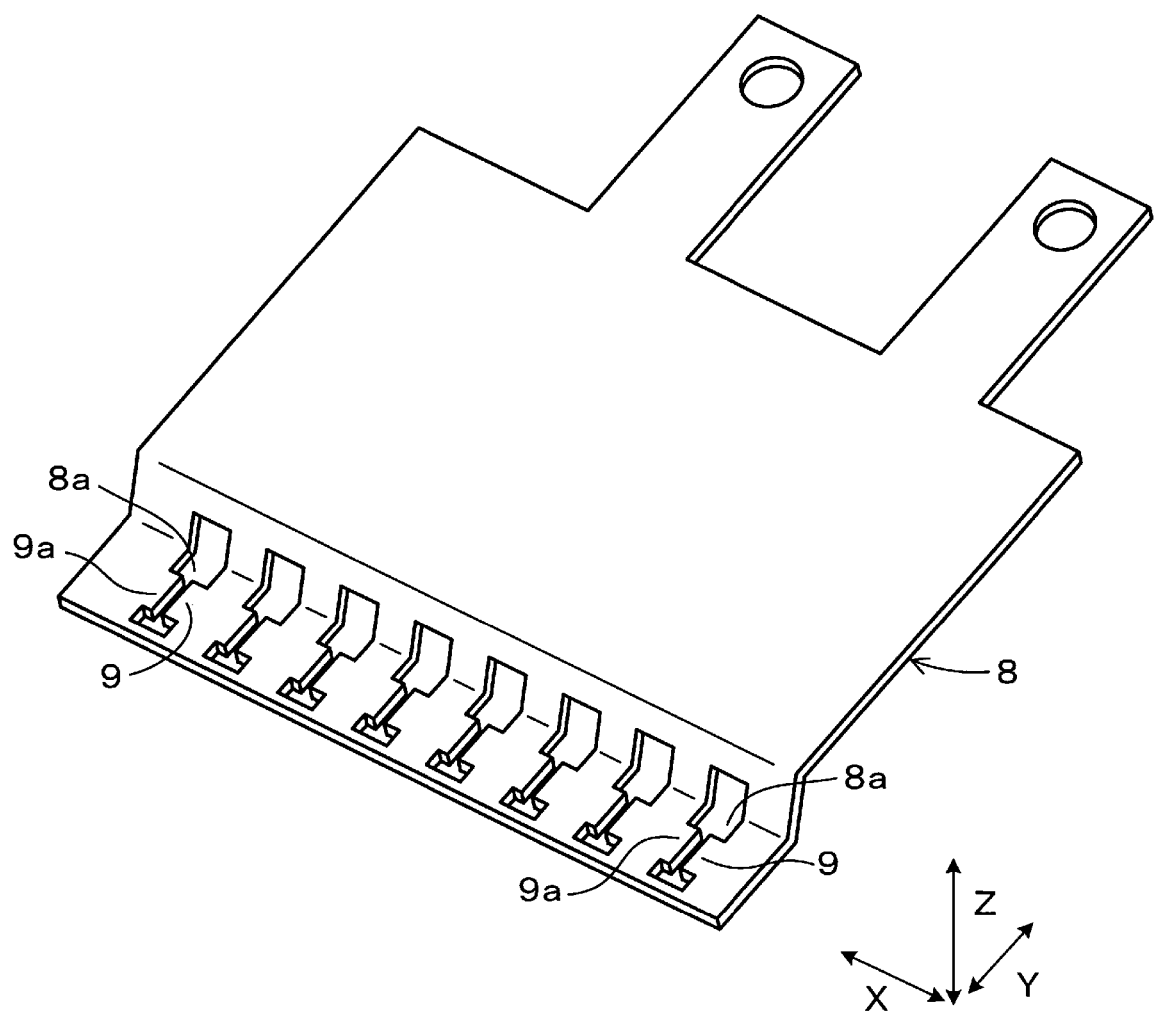
FIG. 9 is a perspective view of the main N bus bar in FIG. 8.
Figure 10:
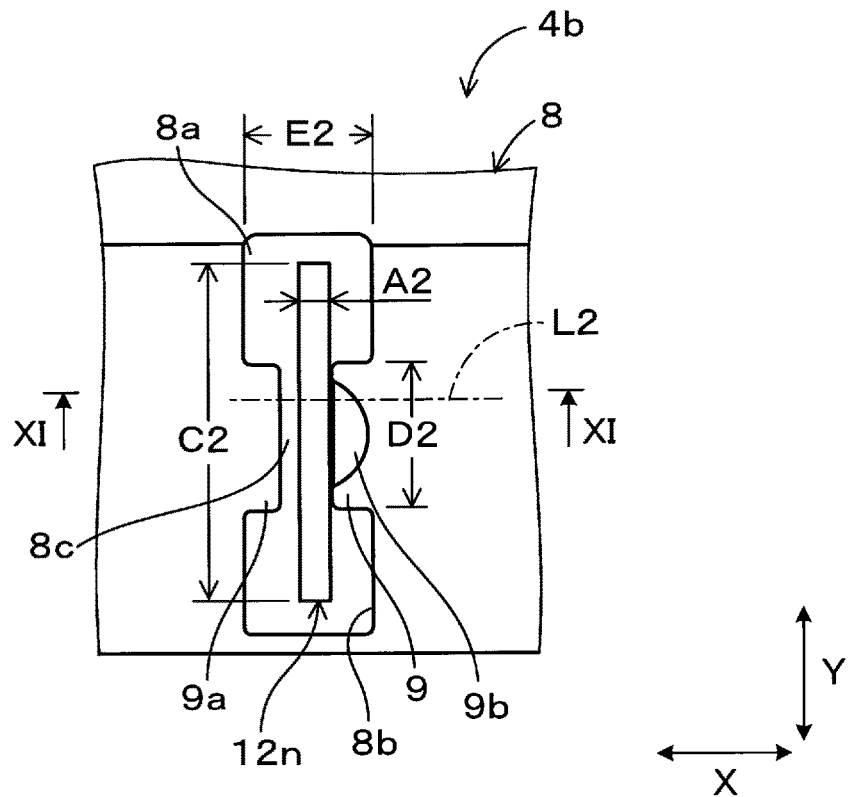
FIG. 10 is a plan view of a Q region in FIG. 8.

As illustrated in FIGS. 9 and 10, the main N bus bar 8 has a plurality of (the same number as the semiconductor modules 11) through-holes 8a into each of which the negative terminal 12n can be inserted and which extend in the second direction Y which is the width direction of the negative terminal 12n, and the bonding part 9 is disposed inside each of the through-holes 8a. In particular, the bonding part 9 includes a projection formed by projecting a part of an inner periphery 8b of the through-hole 8a inward. With the present configuration, the negative terminal 12n is fused and welded to the bonding part 9 in a state of being inserted into the through-hole 8a of the main N bus bar 8.

For this fusion welding, the through-hole 8a of the main N bus bar 8 has an opening width (opening size in the first direction X) and an opening length (opening size in the second direction Y) such that the negative terminal 12n can be inserted. Furthermore, the distance between two adjacent through-holes 8a, 8a is the same as the distance between two adjacent negative terminals 12n, 12n of the semiconductor module 11. Moreover, the through-hole 8a is configured so that an opening size E2 in the first direction X which is the thickness direction of the negative terminal 12n becomes smallest at a narrow portion 8c which corresponds to the bonding part 9.

Furthermore, when the bonding part 9 is denoted as a first projection 9, the main N bus bar 8 includes a second projection 9a formed by projecting a part of an inner periphery 8b of the through-hole 8a inward, separately from the first projection 9, and the first projection 9 and the second projection 9a are arranged facing each other in the first direction X which is the thickness direction of the negative terminal 12n.

As illustrated in FIG. 10, the first projection 9 and the second projection 9a are disposed on a virtual line L2 extending in the first direction X which is the thickness direction of the negative terminal 12n and have approximately the same widths D2 in the second direction Y which is the width direction of the negative terminal 12n.

Figure 11:
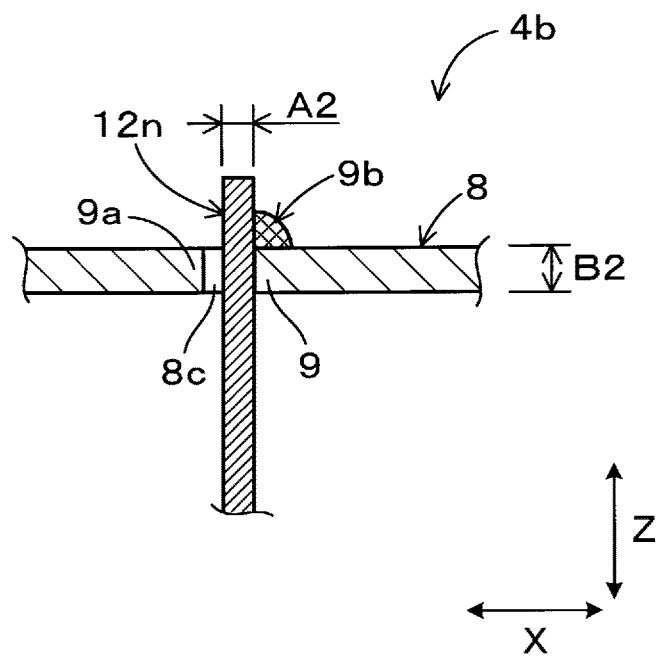
FIG. 11 is a cross-sectional view taken along a line XI-XI in FIG. 10.

As illustrated in FIGS. 10 and 11, a thickness A2 of the negative terminal 12n is less than a thickness B2 of the bonding part 9, and a width C2 of the negative terminal 12n is larger than the width D2 of the bonding part 9. In other words, in the bonding structure 4b, the negative terminal 12n and the bonding part 9 are configured so that one of the negative terminal 12n and the bonding part 9 that has a relatively small thickness is wider than the other having a relatively large thickness.

Furthermore, the negative terminal 12n and bonding part 9 are bonded together by fusion welding in a state where the thickness direction of the negative terminal 12n and the thickness direction of the bonding part 9 are orthogonal to each other. In this case, the first direction X which is the thickness direction of the negative terminal 12n and the third direction Z which is the thickness direction of the bonding part 9 are orthogonal to each other (refer to FIG. 11).

Next, the method for bonding the above-described semiconductor module 11 is described with reference to the flowchart in FIG. 12.

Note that in the present embodiment, the positive terminal 12p of the semiconductor module 11 and the bonding part 7 of the main P bus bar 6 are bonded together in the bonding structure 4a first, and then the negative terminal 12n of the semiconductor module 11 and the bonding part 9 of the main N bus bar 8 are bonded together in the bonding structure 4b.

The bonding methods to be applied to the bonding structure 4a and the bonding structure 4b are substantially the same. Therefore, the following describes only the bonding method to be applied to the bonding structure 4a; description of the bonding method to be applied to the bonding structure 4b is omitted.

Figure 12:
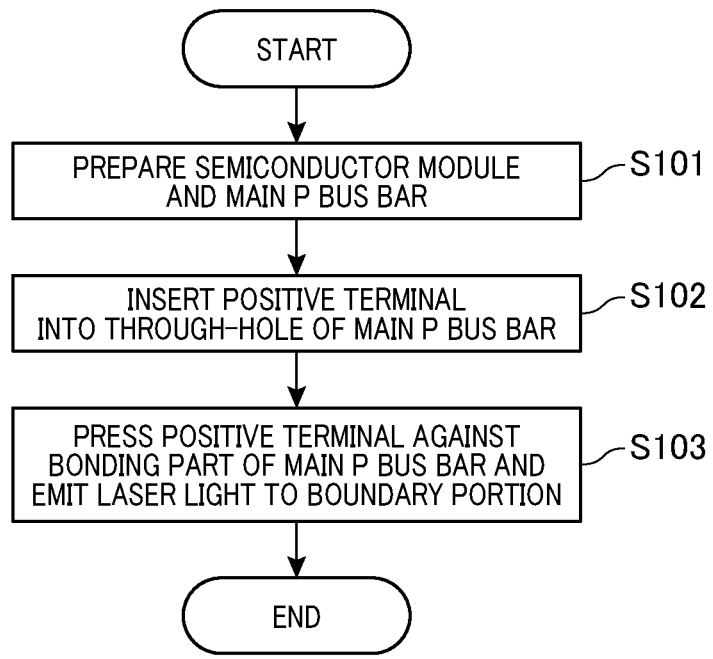
FIG. 12 is a flowchart of a method for bonding the positive terminal of the semiconductor module and the main P bus bar according to the first embodiment.

As illustrated in FIG. 12, the bonding method includes Steps S101 to S103. Each of the steps may be divided into two or more steps or another step may be added thereto, as needed.

Step S101 is a preparation step for preparing the semiconductor module 11 and the main P bus bar 6. In this Step S101, prepared are the semiconductor module 11 and the main P bus bar 6, the sizes of which are set so that the positive terminal 12p which is one of the positive terminal 12p and the bonding part 7 that has a relatively small thickness is wider than the bonding part 7 which is the other having a relatively large thickness.

Each of Steps S102 and S103 is a bonding step for boning the semiconductor module 11 and the main P bus bar 6 together.

Step S102 is a step for inserting the positive terminal 12p of the semiconductor module 11 into the through-hole 6a of the main P bus bar 6 by moving the positive terminal 12p in the third direction Z after Step S101. In this Step S102, the positive terminal 12p of the semiconductor module 11 is inserted into the through-hole 6a of the main P bus bar 6 at the semiconductor module 11 and the main P bus bar 6 prepared in Step S101.

In a state where the positive terminal 12p is inserted into the narrow portion 6c of the through-hole 6a, a tiny gap is formed between the positive terminal 12p and the opening edge 6b of the through-hole 6a. Thus, the positive terminal 12p is easily held in the through-hole 6a.

At this time, since the main P bus bar 6 includes the bonding part 7 inside the through-hole 6a, the positive terminal 12p inserted into the through-hole 6a is easily pressed against the bonding part 7 of the main P bus bar 6, facilitating the operation for bonding the positive terminal 12p and the bonding part 7 together.

In particular, since the opening size E1 of the through-hole 6a in the first direction X is set smallest at the narrow portion 6c corresponding to the bonding part 7, the gap between the positive terminal 12p and the opening edge 6b of the through-hole 6a is small in the state where the positive terminal 12p is inserted into the narrow portion 6c of the through-hole 6a. Therefore, at the time of the operation for bonding the positive terminal 12p and the bonding part 7 together, the positive terminal 12p can be restricted from excessively moving relative to the bonding part 7.

Furthermore, when the first projection 7 and the second projection 7a each of which is a bonding part provided inside the through-hole 6a are arranged facing each other in the first direction X, in particular, when two projections 7, 7a are disposed on the virtual line L1, the positive terminal 12p can be prevented from coming into contact with portions of the opening edge 6b of the through-hole 6a other than the bonding part 7. Moreover, with such arrangement, an operator can easily understand the position of the bonding part 7.

In particular, when the first projection 7 and the second projection 7a have approximately the same widths D1 in the second direction Y, the positive terminal 12p inserted into the through-hole 6a can be prevented from tilting at different angles on the left and right sides upon leftward and rightward tilting movements around a virtual axis extending in the third direction Z. Therefore, an operator can smoothly perform the operation for bonding the positive terminal 12p and the bonding part 7 together by checking the movement of the positive terminal 12p in the through-hole 6a.

Furthermore, since the bonding part 7 of the main P bus bar 6 includes a projection formed by projecting a part of an inner periphery 6b of the through-hole 6a inward, in other words, since the bonding part 7 of the main P bus bar 6 is formed using a portion of the opening edge 6b of the through-hole 6a, the structure of the main P bus bar 6 can be simplified.

Step S103 is a step for pressing the positive terminal 12p against the bonding part 7 of the main P bus bar 6 and emitting laser light to the boundary portion after Step S102. In this Step S103, both of the positive terminal 12p inserted into the through-hole 6a of the main P bus bar 6 in Step S102 and the bonding part 7 of the main P bus bar 6 are fused and welded through fusion and solidification by laser irradiation. As a result, the welded part 7b is formed at the boundary portion between the positive terminal 12p and the bonding part 7.

The fusion welding by laser irradiation is a bonding method in which as a heat source, laser light, is collected and emitted onto a metal material so that the metal material is locally fused and solidified, resulting in bonding.

Note that instead of the fusion welding by laser irradiation, arc welding which is a welding method for joining metal materials together by using an electrical discharge phenomenon (arc discharge) in a gas can be used.

Next, the functions and advantageous effects of the above-described power conversion device 1 are described.

With the bonding structure 4a of the semiconductor module 11 and the bonding method therefor, when the thickness A1 of the positive terminal 12p of the semiconductor module 11 is less than the thickness B1 of the bonding part 7 of the main P bus bar 6, the amount of welding heat input per unit volume can be balanced between the positive terminal 12p and the bonding part 7 of the main P bus bar 6 by adjusting the shapes of the positive terminal 12p and the bonding part 7 to set the width relationship therebetween according to the thickness relationship therebetween, specifically, by setting the width C1 of the positive terminal 12p larger than the width D1 of the bonding part 7. This amount of welding heat input is defined as an amount of heat that is provided from the outside to the boundary portion between the positive terminal 12p and the bonding part 7 during fusion welding.

This prevents surplus welding heat input from being applied to the boundary portions to fuse both of the positive terminal 12p and the bonding part 7, preventing an increase in energy cost for fusion welding of the both.

Furthermore, with the bonding structure 4b of the semiconductor module 11 and the bonding method therefor, when the thickness A2 of the negative terminal 12n of the semiconductor module 11 is less than the thickness B2 of the bonding part 9 of the main N bus bar 8, the amount of welding heat input per unit volume can be balanced between the negative terminal 12n and the bonding part 9 of the main N bus bar 8 by adjusting the shapes of the negative terminal 12n and the bonding part 9 to set the width relationship therebetween according to the thickness relationship therebetween, specifically, by setting the width C2 of the negative terminal 12n larger than the width D2 of the bonding part 9. This amount of welding heat input is defined as an amount of heat that is externally provided to the boundary portion between the negative terminal 12n and the bonding part 9 during fusion welding.

This prevents surplus welding heat input from being applied to the boundary portions to fuse both of the negative terminal 12n and the bonding part 9, preventing an increase in energy cost for fusion welding.

Thus, the amount of welding heat input during fusion welding to bond each of the two terminals 12p, 12n, which are power terminals, of the semiconductor module 11 and a corresponding one of the two bus bars 6, 8 can be minimized.

Note that as a modification of the first embodiment described above, one of the two bonding structures 4a, 4b may be replaced by a different bonding structure.

Hereinafter, other embodiments related to the first embodiment described above are described with reference to the drawings. In the other embodiments, elements identical to the elements in the first embodiment are given the same reference signs, and description thereof is omitted.

Second Embodiment

Figure 13:
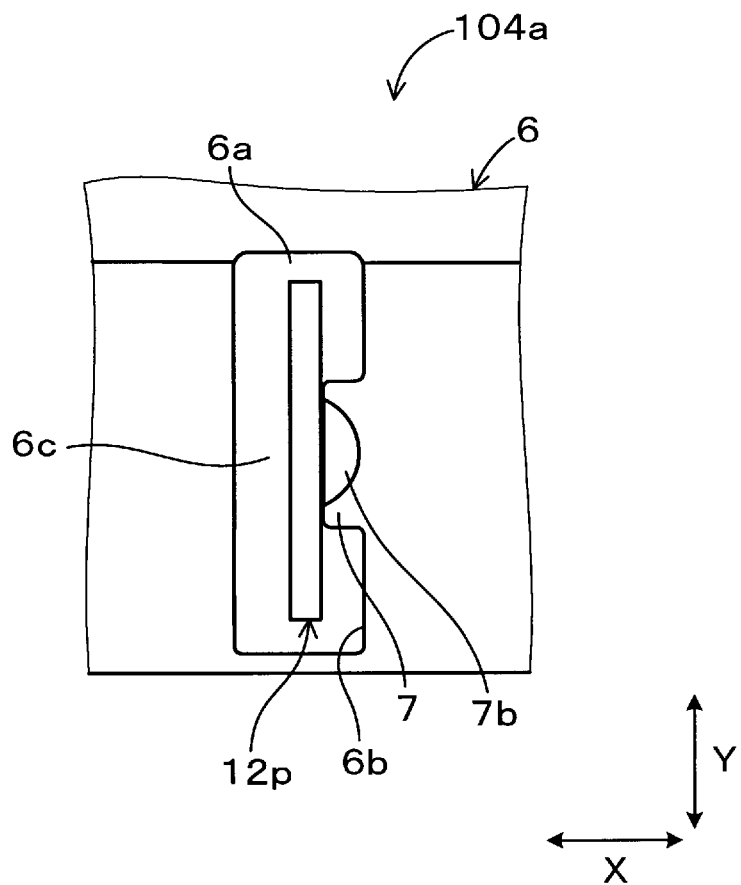
FIG. 13 is a plan view of an area in a power conversion device according to a second embodiment that corresponds to FIG. 6 in the first embodiment.

As illustrated in FIG. 13, a bonding structure 104a of the semiconductor module 11 according to a second embodiment is different from the bonding structure 4a of the semiconductor module 11 according to the first embodiment in that the main P bus bar 6 does not include a portion corresponding to the second projection 7a.

The other details are substantially the same as those in the first embodiment.

In the second embodiment, the structure of the through-hole 6a of the main P bus bar 6 can be simplified.

Aside from this, functions and advantageous effects substantially the same as those in the first embodiment are obtained.

Note that as a modification of the bonding structure 4b in the first embodiment, a structure substantially the same as the bonding structure 104a in the second embodiment can be used. Specifically, a portion of the main N bus bar 8 that corresponds to the second projection 9a can be omitted.

Third Embodiment

Figure 14:
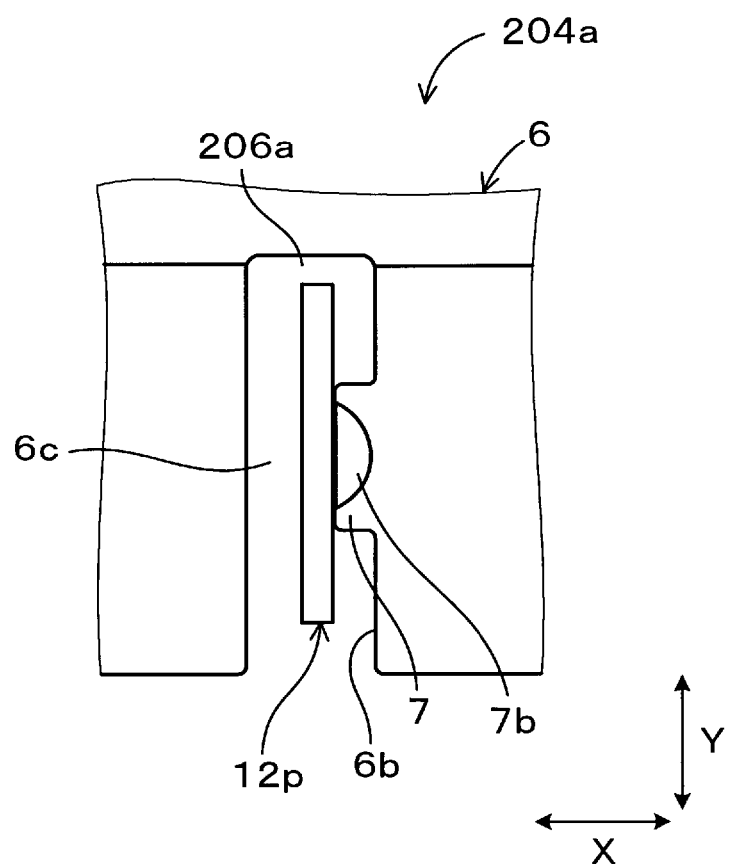
FIG. 14 is a plan view of an area in a power conversion device according to a third embodiment that corresponds to FIG. 6 in the first embodiment.

As illustrated in FIG. 14, a bonding structure 204a of the semiconductor module 11 according to a third embodiment is different from the bonding structure 4a of the semiconductor module 11 according to the first embodiment in that the main P bus bar 6 includes a notch 206a instead of the through-hole 6a.

The other details are substantially the same as those in the first embodiment.

In the third embodiment, upon bonding the positive terminal 12p to the bonding part 7 of the main P bus bar 6, available degrees of freedom of the positive terminal 12p relative to the main P bus bar 6 include both of movement in the third direction Z and sliding movement in the second direction Y.

Aside from this, functions and advantageous effects substantially the same as those in the first embodiment are obtained.

Note that as a modification of the bonding structure 4b in the first embodiment, a structure substantially the same as the bonding structure 204a in third embodiment can be used. Specifically, a notch having the same shape as the notch 206a can be provided instead of the through-hole 8a of the main N bus bar 8.

The present disclosure has been described in accordance with the embodiments, but the present disclosure should in no way be construed as being limited to the embodiments, the structure, etc. The present disclosure encompasses various modifications and variations made within the range of equivalence. In addition, various combinations and forms, and furthermore, other combinations and forms including only one element of these and elements no less than or no more than these are also included in the scope or concept range of the present disclosure.

Although the above embodiments exemplify the cases where the thickness A1 of the positive terminal 12p is less than the thickness B1 of the bonding part 7 of the main P bus bar 6, a structure in which the thickness A1 of the positive terminal 12p is larger than the thickness B1 of the bonding part 7 can be used instead. In this case, it is sufficient that the sizes be set so that the width C1 of the positive terminal 12p exceeds the width D1 of the bonding part 7.

Similarly, although the above embodiments exemplify the cases where the thickness A2 of the negative terminal 12n is less than the thickness B2 of the bonding part 9 of the main N bus bar 8, a structure in which the thickness A2 of the negative terminal 12n is larger than the thickness B2 of the bonding part 9 can be used instead. In this case, it is sufficient that the sizes be set so that the width C2 of the negative terminal 12n exceeds the width D2 of the bonding part 9.

Although the above embodiments exemplify the cases where the bonding part 7 of the main P bus bar 6 is formed using a portion of the opening edge 6b of the through-hole 6a, another member corresponding to the bonding part 7 may be bonded to the main P bus bar 6 instead. Similarly, although the above embodiments exemplify the cases where the bonding part 9 of the main N bus bar 8 is formed using a portion of the opening edge 8b of the through-hole 8a, another member corresponding to the bonding part 9 may be bonded to the main N bus bar 8 instead.

What is claimed is:

1. A semiconductor module bonding structure, comprising:
   a semiconductor module including a semiconductor element and a plate-shaped power terminal which is electrically connected to the semiconductor element; and
   a bus bar including a plate-shaped bonding part, the bonding part being bonded to the power terminal of the semiconductor module, wherein
   the power terminal of the semiconductor module and the bonding part of the bus bar are configured such that a width of a one of the power terminal or the bonding part that has the smaller thickness is larger than a width of the other one of the power terminal or the bonding part that has the larger thickness, and the power terminal and the bonding part are bonded together by fusion welding in a state where the thickness directions of the power terminal and the bonding part are orthogonal to each other, and
   the bonding part includes a projection that is arranged projecting along a thickness direction of the power terminal,
   the bus bar includes a through-hole configured so that an opening size in the thickness direction of the power terminal has a smallest portion at a portion corresponding to the bonding part, and
   a welded part formed by the fusion welding is formed at a boundary portion between the power terminal and the bonding part, and extends outward, from a narrow portion that is a smallest portion of the opening of the through-hole, along the thickness direction of the power terminal,
   wherein the power terminal is offset from a central axis of the through-hole such that the narrow portion of the through hole is provided so as to form a gap between a first side of the power terminal and the projection, the first side of the power terminal being a side of the power terminal that faces the projection, while the power terminal directly contacts the welded part at a second side of the power terminal opposite to the first side.

2. The semiconductor module bonding structure according to claim 1, wherein
   a thickness of the power terminal is less than a thickness of the bonding part, and a width of the power terminal is larger than a width of the bonding part.

3. The semiconductor module bonding structure according to claim 1, wherein
   when the projection is denoted as a first projection, the bus bar includes a second projection formed by projecting a part of an inner periphery of the through-hole inward, separately from the first projection, and the first projection and the second projection are arranged facing each other in a thickness direction of the power terminal.

4. The semiconductor module bonding structure according to claim 3, wherein
   the first projection and the second projection have approximately the same widths in the width direction of the power terminal.

5. The semiconductor module bonding structure according to claim 1, wherein the bus bar does not include a projection that faces the first projection in the thickness direction of the positive terminal.

6. A semiconductor module bonding method for bonding a plate-shaped power terminal, being electrically connected to a semiconductor element, and a plate-shaped bonding part of a bus bar together in a semiconductor module, the semiconductor module bonding method comprising the steps of:
   preparing the semiconductor module and the bus bar such a width of a one of the power terminal or the bonding part that has the smaller thickness is larger than a width of the other one of the power terminal or the bonding part that has the larger thickness, and the bus bar includes a through-hole configured so that an opening size in the thickness direction of the power terminal has a smallest portion at a portion corresponding to the bonding part; and
   bonding, in the semiconductor module and the bus bar prepared in the preparing step, boundary portions of the power terminal and the bonding part together by fusion welding in a state where the power terminal and the bonding part are arranged in contact with each other such that the thickness directions of the power terminal and the bonding part are orthogonal to each other, wherein the bonding part includes a projection that is arranged projecting along a thickness direction of the power terminal,
   the bonding further including forming a welded part by the fusion welding at a boundary portion between the power terminal and the bonding part, and extends outward, from a narrow portion that is a smallest portion of the opening of the through-hole, along the thickness direction of the power terminal,
   wherein the power terminal is offset from a central axis of the through-hole such that the narrow portion of the through hole is provided so as to form a gap between a first side of the power terminal and the projection, the first side of the power terminal being a side of the power terminal that faces the projection, while the power terminal directly contacts the welded part at a second side of the power terminal opposite to the first side.

* * * * *